(12) United States Patent
Sakai

(10) Patent No.: US 8,558,933 B2
(45) Date of Patent: Oct. 15, 2013

(54) IMAGING DEVICE AND IMAGING APPARATUS

(75) Inventor: Naofumi Sakai, Fukuoka (JP)

(73) Assignee: Sony Corporation, Tokyo (JP)

( * ) Notice: Subject to any disclaimer, the term of this patent is extended or adjusted under 35 U.S.C. 154(b) by 24 days.

(21) Appl. No.: 13/302,603

(22) Filed: Nov. 22, 2011

(65) Prior Publication Data

US 2012/0147233 A1 Jun. 14, 2012

(30) Foreign Application Priority Data

Dec. 9, 2010 (JP) ................................. 2010-274259

(51) Int. Cl.
*H04N 5/335* (2011.01)

(52) U.S. Cl.
USPC .......................................... 348/308; 348/294

(58) Field of Classification Search
USPC ........ 348/308; 250/208.1; 257/291, 292, 294, 257/440, 443–448
See application file for complete search history.

(56) References Cited

U.S. PATENT DOCUMENTS

| 2007/0206242 | A1* | 9/2007 | Smith | 358/505 |
| 2009/0109311 | A1* | 4/2009 | Mabuchi | 348/302 |
| 2009/0190021 | A1* | 7/2009 | Nitta et al. | 348/308 |
| 2010/0020211 | A1* | 1/2010 | Inada | 348/294 |
| 2010/0331039 | A1* | 12/2010 | Hezar | 455/550.1 |

FOREIGN PATENT DOCUMENTS

JP 2006-211630 8/2006

* cited by examiner

*Primary Examiner* — Tuan Ho
*Assistant Examiner* — Chan Nguyen
(74) *Attorney, Agent, or Firm* — Rader, Fishman & Grauer PLLC

(57) ABSTRACT

An imaging device includes: a pixel array that has a plurality of pixels disposed according to an oblique pixel arrangement; a first conversion means for performing digital conversion for pixel signals output from pixels in an even column of the pixel array; a second conversion means for performing digital conversion for pixel signals output from pixels in an odd column of the pixel array; and an addition means for adding pixel data output from the first conversion means and the second conversion means, wherein each of the first conversion means and the second conversion means includes a counter having a flip-flop, a first latch circuit, and a second latch circuit.

11 Claims, 13 Drawing Sheets

IMAGING DEVICE AND IMAGING APPARATUS

FIELD

The present disclosure relates to an imaging device and an imaging apparatus, and more particularly to an imaging device and an imaging apparatus capable of preventing reduction in a pixel information amount and improving a saturated signal amount.

BACKGROUND

In recent years, in an imaging apparatus, increasing the number of pixels of the imaging device has progressed, and a technique of improving an effective integration degree of the pixels including photoelectric conversion devices has been developed.

For example, the present applicant has developed a solid-state imaging device which has an oblique pixel arrangement configuration in which each pixel in an even column is arranged to be misaligned by about ½ pitch of a pitch between pixels within a pixel column in the column direction with respect to each pixel in an odd column, and each pixel in an even column is arranged to be misaligned by about ½ pitch of a pitch between pixels within a pixel row in the row direction with respect to each pixel in an odd row (refer to JP-A-2006-211630).

In the solid-state imaging device employing the oblique pixel arrangement configuration disclosed in JP-A-2006-211630, information for a pixel is added to a plurality of pixels so as to reduce a pixel information amount, thereby improving a frame rate. In addition, by adding information for a pixel to a plurality of pixels in this way, an amount of charge (a saturated signal amount (Qs)) accumulated in each pixel can be improved.

SUMMARY

However, in the imaging device disclosed in JP-A-2006-211630, since only a portion of all pixels of the imaging device becomes addition targets, and information for pixels which are not the addition targets is not output, a pixel information amount is reduced.

Thus, it is desirable to prevent reduction in a pixel information amount and improve a saturated signal amount.

An embodiment of the present disclosure is directed to an imaging device including a pixel array that has a plurality of pixels disposed according to an oblique pixel arrangement; a first conversion means for performing digital conversion for pixel signals output from pixels in an even column of the pixel array; a second conversion means for performing digital conversion for pixel signals output from pixels in an odd column of the pixel array; and an addition means for adding pixel data output from the first conversion means and the second conversion means, wherein each of the first conversion means and the second conversion means includes a counter having a flip-flop, a first latch circuit, and a second latch circuit.

Another embodiment of the present disclosure is directed to an imaging apparatus including an imaging device having a pixel array that has a plurality of pixels disposed according to an oblique pixel arrangement; a first conversion means for performing digital conversion for pixel signals output from pixels in an even column of the pixel array; a second conversion means for performing digital conversion for pixel signals output from pixels in an odd column of the pixel array; and an addition means for adding pixel data output from the first conversion means and the second conversion means, wherein each of the first conversion means and the second conversion means includes a counter having one flip-flop and two latch circuits.

In the embodiments of the present disclosure, the counter included in each of the first conversion means and the second conversion means has the flip-flop, the first latch circuit, and the second latch circuit.

According to the embodiments, it is possible to prevent reduction in a pixel information amount and improve a saturated signal amount.

DETAILED DESCRIPTION

Hereinafter, embodiments of the present disclosure will be described with reference to the drawings.

Figure 1:
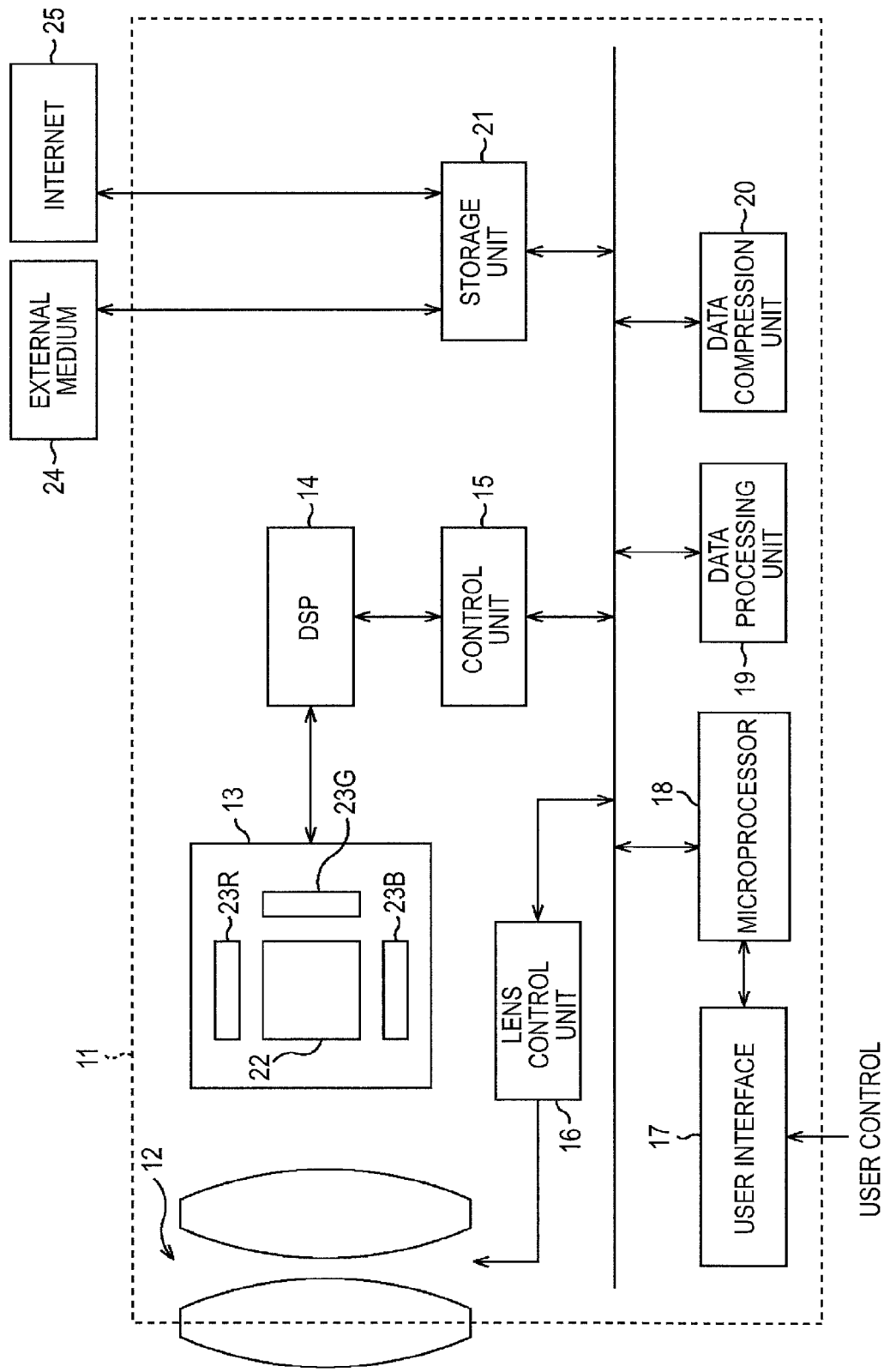
FIG. 1 is a block diagram illustrating a configuration example of the imaging apparatus according to an embodiment of the present disclosure.

FIG. 1 is a block diagram illustrating a configuration example of the imaging apparatus according to an embodiment of the present disclosure.

In FIG. 1, the imaging apparatus 11 includes a lens unit 12, an imaging unit 13, a DSP (Digital Signal Processor) 14, a control unit 15, a lens control unit 16, a user interface 17, a microprocessor 18, a data processing unit 19, a data compression unit 20, and a storage unit 21.

The lens unit 12 has a group of a plurality of lenses such as a zoom lens and an image forming lens, and collects light from a subject (not shown).

The imaging unit 13 includes a prism 22 which separates light collected by the lens unit 12 into three primary colors, and three CMOS (Complementary Metal Oxide Semiconductor) sensors 23R, 23G and 23B which respectively sense the light separated by the prism 22.

In other words, the light collected by the lens unit 12 is separated by the prism 22, thereby the red component light forms an image on the CMOS sensor 23R, the green component light forms an image on the CMOS sensor 23G, and the blue component light forms an image on the CMOS sensor 23B. The CMOS sensors 23R, 23G and 23B supply pixel data corresponding to an amount of light sensed by the respective pixels to the DSP 14. In addition, when distinction between the CMOS sensors 23R, 23G and 23B is not necessary, they are appropriately referred to as a CMOS sensor 23.

The DSP 14 builds an image by performing a signal process for the pixel data output from the CMOS sensor 23, and supplies the image data to the control unit 15.

The control unit 15 controls each block of the imaging apparatus 11. For example, it is assumed that a control signal indicating that a user operates a shutter button (not shown) is supplied to the control unit 15 via the user interface 17 and the microprocessor 18. In this case, in response to the user control, the control unit 15 supplies the image data output from the DSP 14 to the data processing unit 19 for a data process, supplies the processed data to the data compression unit 20 for compression, and then supplies the compressed data to the storage unit 21 for storage.

For example, if a control signal indicating that the user operates a zoom lever (not shown) is supplied via the user interface 17 and the microprocessor 18, the lens control unit 16 drives the lens unit 12 so as to adjust zoom magnification in response to the user control.

If the user operates an operation unit (not shown), the user interface 17 obtains a control signal corresponding to the operation of the user and supplies the control signal to the microprocessor 18. The microprocessor 18 supplies the control signal from the user interface 17 to a block suitable for the control.

The data processing unit 19 performs a data process such as white balance or noise removal for the image data output from the DSP 14. The data compression unit 20 compresses the image data for which the data process is performed by the data processing unit 19, by a JPEG (Joint Photographic Experts Group) scheme or the like.

The storage unit 21 includes a storage portion such as a flash memory (for example, an EEPROM (Electronically Erasable and Programmable Read Only Memory)), and stores the image data which is compressed by the data compression unit 20. The image data stored in the storage unit 21 may be transmitted to an external medium 24 via a drive (not shown), and may be uploaded to the Internet 25 via a communication unit (not shown).

Figure 2:
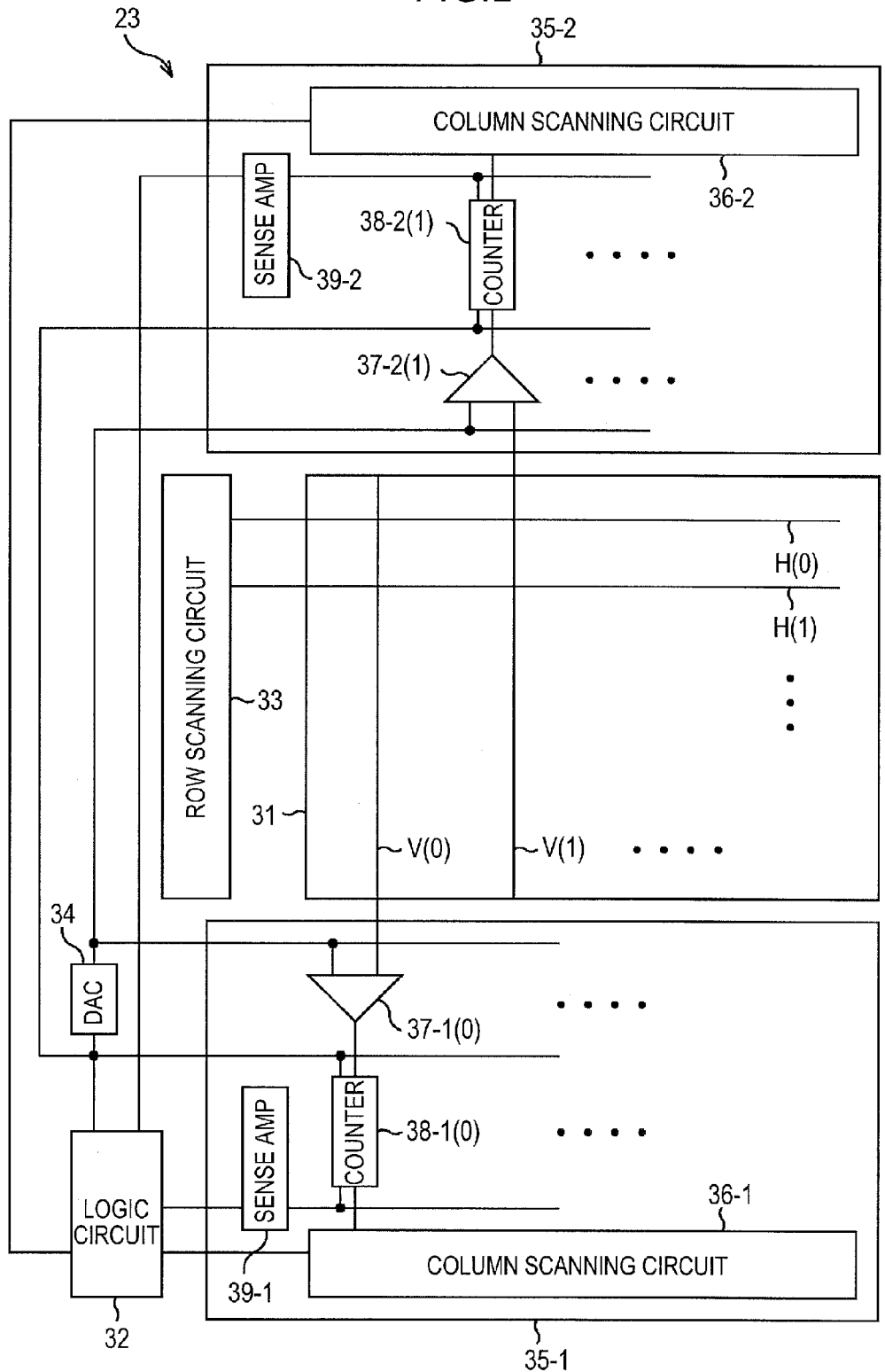
FIG. 2 is a block diagram illustrating a configuration example of the CMOS sensor.

Next, FIG. 2 is a block diagram illustrating a configuration example of the CMOS sensor 23.

In FIG. 2, the CMOS sensor 23 includes a pixel array 31, a logic circuit 32, a row scanning circuit 33, a DAC (Digital Analog Converter) 34, and two column parallel AD (Analog Digital) conversion circuits 35-1 and 35-2.

Figure 3A:
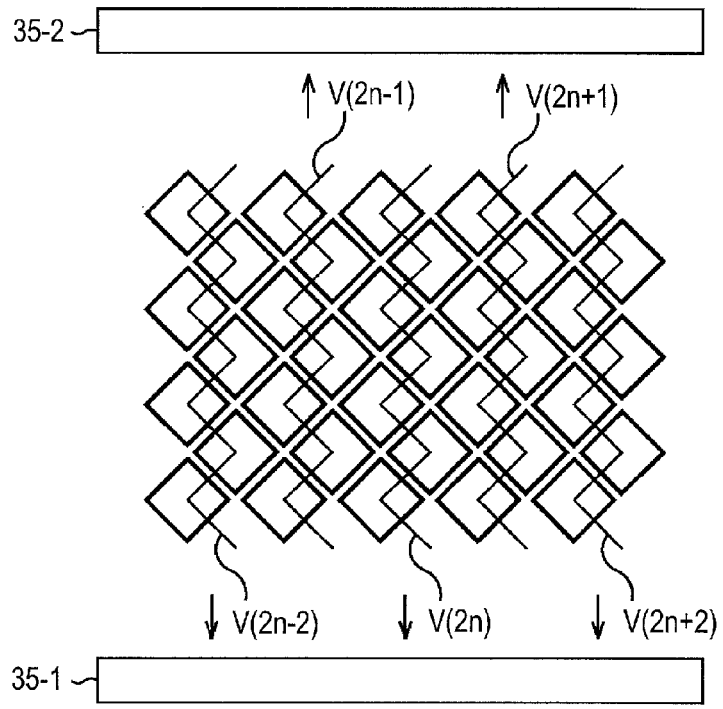
FIGS. 3A and 3B are diagrams illustrating an arrangement of pixels of the pixel array.
Figure 3B:
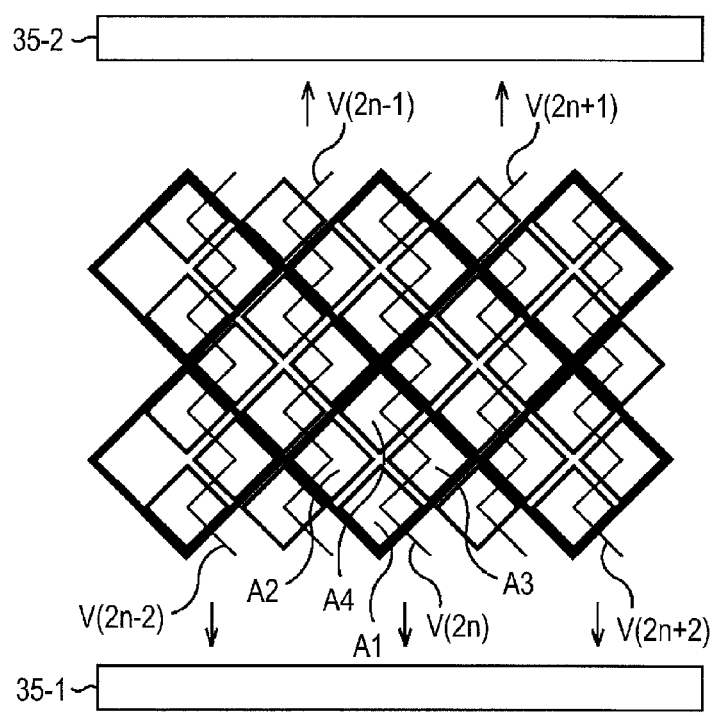

The pixel array 31 includes a plurality of pixels arranged in a two-dimensional manner. For example, when M×N pixels are arranged in rows and columns, a pixel in the m-th row and the n-th column is disposed at an intersection where a horizontal signal line H(m) connected to the row scanning circuit 33 and a vertical signal line V(n) connected to the column parallel AD conversion circuits 35-1 and 35-2 intersect each other. Here, m is an integer of 0 to M, and n is an integer of 0 to N. In addition, the pixels are arranged in an oblique pixel arrangement as shown in FIGS. 3A and 3B described later.

In addition, among the vertical signal lines V connected to the pixel arranged in the column direction of the pixel array 31, the vertical signal lines V(2n) in the even columns are connected to the column parallel AD conversion circuit 35-1 which is disposed at the lower side (south) of the pixel array 31. On the other hand, the vertical signal lines V(2n+1) in the odd columns are connected to the column parallel AD conversion circuit 35-2 which is disposed at the upper side (north) of the pixel array 31. In the example shown in FIG. 2, the 0-th vertical signal line V(0) is connected to the column parallel AD conversion circuit 35-1, and the first vertical signal line V(1) is connected to the column parallel AD conversion circuit 35-2.

The logic circuit 32 supplies clock signals or timing signals necessary for each operation to the row scanning circuit 33, the DAC 34, and the column parallel AD conversion circuits 35-1 and 35-2. In addition, the logic circuit 32 adds pixel data output from the column parallel AD conversion circuits 35-1 and 35-2 so as to be output to the rear stage (for example, the DSP 14 in FIG. 1).

The row scanning circuit 33 outputs driving signals for driving (transmission, selection, reset, and the like) of the pixels of the pixel array 31 row by row via the horizontal signal line H(m).

The DAC 34 generates a ramp signal having a shape (almost saw-tooth shape) where a voltage drops with a constant slope from a predetermined voltage value and then returns to the predetermined voltage value, in response to a timing signal from the logic circuit 32, and supplies the ramp signal to the column parallel AD conversion circuits 35-1 and 35-2.

The column parallel AD conversion circuit 35-1 has a column scanning circuit 36-1, a predetermined number of comparators 37-1, a predetermined number of counters 38-1, and a sense amplifier (Sense Amp) 39-1. In the same manner, the column parallel AD conversion circuit 35-2 has a column scanning circuit 36-2, a predetermined number of comparators 37-2, a predetermined number of counters 38-2, and a sense amplifier 39-2.

Here, the vertical signal lines V(2n) in the even columns are connected to the column parallel AD conversion circuit 35-1, and the vertical signal lines V(2n+1) in the odd columns are connected to the column parallel AD conversion circuit 35-2. In addition, when the number of columns of the pixel array 31 is N, the column parallel AD conversion circuit 35-1 includes N/2 comparators 37-1 and counters 38-1, and pixel data of the pixels in the 2n-th column is processed by the comparator 37-1(2n) and the counter 38-1(2n). In the same manner, the column parallel AD conversion circuit 35-2 includes N/2 comparators 37-2 and counters 38-2, and pixel data of the pixels in the (2n+1)-th column is processed by the comparator 37-2(2n+1) and the counter 38-2(2n+1).

That is to say, the column parallel AD conversion circuit 35-1 AD-converts pixel data of pixels in the even columns of the pixel array 31, and, the column parallel AD conversion circuit 35-2 AD-converts pixel data of pixels in the odd columns of the pixel array 31.

The column scanning circuits 36-1 and 36-2 respectively supply signals for outputting pixel data at a predetermined timing to the counters 38-1 and 38-2.

The comparators 37-1 and 37-2 compare the ramp signal supplied from the DAC 34 with a pixel signal (luminance value) output from each pixel of the pixel array 31, and supply a comparison result signal obtained as a result thereof to the counters 38-1 and 38-2.

The counters 38-1 and 38-2 respectively count a counter clock signal with a predetermined frequency in response to the comparison result signal output from the comparators 37-1 and 37-2 and the control signal from the logic circuit 32. Thereby, the counters 38-1 and 38-2 output pixel data obtained by digitalizing the pixel signal of each pixel, read by the comparators 37-1 and 37-2. Configurations of the counters 38-1 and 38-2 will be described later with reference to FIGS. 4 and 5.

The sense amplifiers 39-1 and 39-2 respectively amplify the pixel data output from the counters 38-1 and 38-2 and supply the amplified pixel data to the logic circuit 32.

Next, with reference to FIGS. 3A and 3B, an arrangement of the pixels of the pixel array 31 will be described.

FIGS. 3A and 3B partially show a plurality of pixels of the pixel array 31, and each pixel is arranged in a state of being tilted by 45 degrees obliquely.

In other words, four sides of each of the square pixels shown in FIGS. 3A and 3B are tilted by 45 degrees with respect to the up and down directions of the pixel array 31, that is, the directions where the column parallel AD conversion circuits 35-1 and 35-2 are disposed. In addition, each pixel in an even column is arranged to be misaligned by about ½ pitch of a pitch between pixels within a pixel column in the column direction with respect to each pixel in an odd column, and each pixel in an even column is arranged to be misaligned by about ½ pitch of a pitch between pixels within a pixel row in the row direction with respect to each pixel in an odd row.

Therefore, the vertical signal lines V connected to the respective pixels in the oblique pixel arrangement for each row have a shape which is bent by 90 degrees with respect to each other for each pixel, that is, a so-called zigzag shape. As such, a plurality of pixels connected to the zigzag-shaped vertical signal line V are pixels of one column in the pixel array 31.

In addition, as described above, pixel signals of pixels in the even column are output to the column parallel AD conversion circuit 35-1 via the vertical signal lines V in the even column (the vertical signal line V(2n−2), the vertical signal line V(2n), and the vertical signal line V(2n+2)). On the other hand, pixel signals of pixels in the odd column are output to the column parallel AD conversion circuit 35-2 via the vertical signal lines V in the odd column (the vertical signal line V(2n−1) and the vertical signal line V(2n+1)).

Here, an example of performing an addition process for four adjacent pixels, specifically, an example of performing the addition process every four pixels surrounded by the thick frame in FIG. 3B will be described.

For example, as shown in FIG. 3B, when attention is paid to the pixel A1, the pixel A2, the pixel A3, and the pixel A4, a pixel signal of the pixel A2 disposed in the odd column is supplied to the column parallel AD conversion circuit 35-2 via the vertical signal line V(2n−1). On the other hand, pixel signals of the pixel A1, the pixel A3, and the pixel A4 disposed in the even column are supplied to the column parallel AD conversion circuit 35-1 via the vertical signal line V(2n).

As such, in the CMOS sensor 23, in order to perform the addition process for four adjacent pixels, it is necessary to add the pixel signal of the odd column pixel A2 output to the column parallel AD conversion circuit 35-2 and the pixel signals of the even column pixels A1, A3 and A4 output to the column parallel AD conversion circuit 35-1. In addition, if the addition process is to be effectively performed in the logic circuit 32, the column parallel AD conversion circuits 35-1 and 35-2 hold pixel data until pixel data of pixels which are addition targets is collected, and then pixel data of four pixels is preferably transmitted to the logic circuit 32 at the same time.

Therefore, in the CMOS sensor 23, the counter 38 of the column parallel AD conversion circuits 35-1 and 35-2 hold pixel data until reaching a timing when the pixel data is transmitted to the logic circuit 32.

Figure 4:
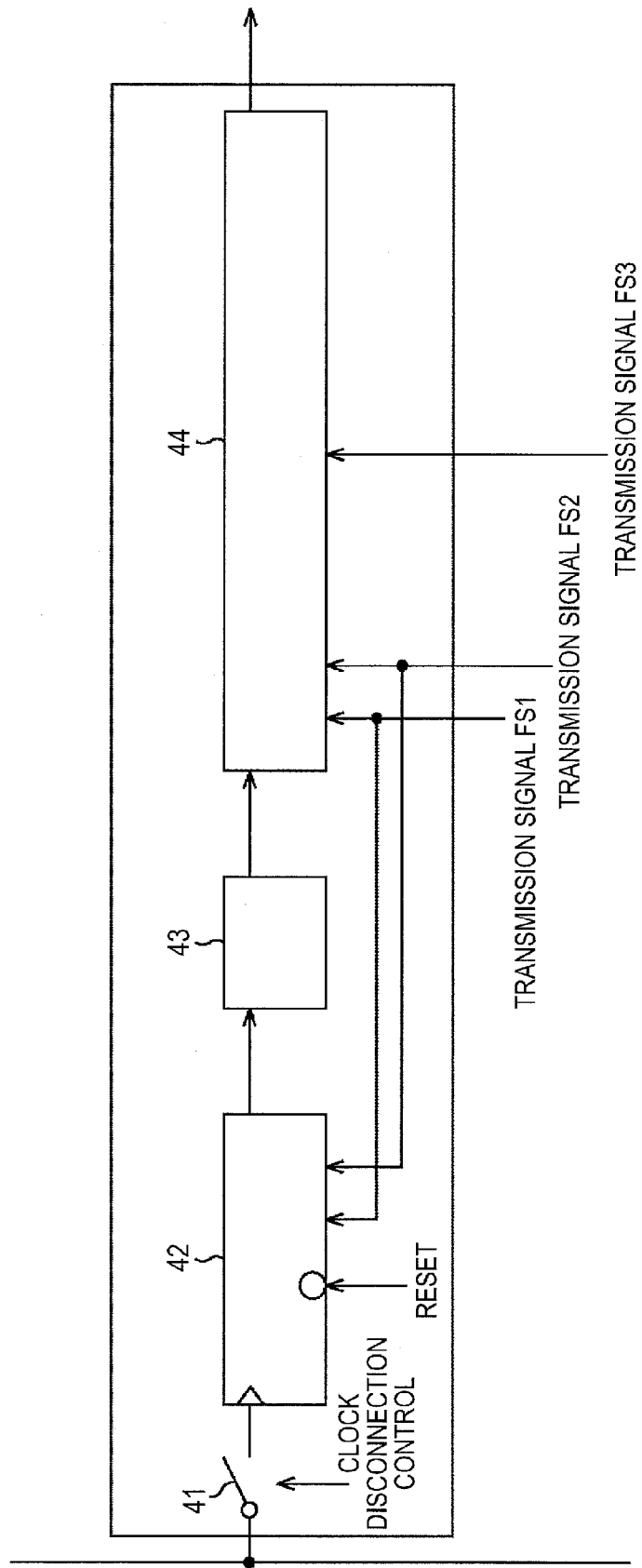
FIG. 4 is a block diagram illustrating a configuration example of the counter.

FIG. 4 is a block diagram illustrating a configuration example of the counter 38.

The counter 38 includes a switch 41, a flip-flop 42, a level shifter 43, and a latch circuit 44.

The switch 41 switches between connection and disconnection of a signal line transmitting a counter clock signal with a predetermined frequency to and from the flip-flop 42, in response to, for example, a clock disconnection control signal supplied from the logic circuit 32.

The flip-flop 42 is a circuit which can hold N-bit (for example, 14-bit) data, resets held pixel data according to a timing of a reset signal supplied from the logic circuit 32, and starts counting the counter clock signal supplied from the signal line via the switch 41. In addition, the flip-flop 42 newly holds the number of counts of a time period corresponding to the comparison result signal output from the comparator 37, as pixel data.

The level shifter 43 shifts a level of the signal output from the flip-flop 42 to a predetermined voltage necessary for a process in the latch circuit 44.

The latch circuit 44 is a circuit which can hold N-bit (for example, 14-bit) data, holds the pixel data output from the flip-flop 42 via the level shifter 43, and outputs the pixel data to the logic circuit 32 via the sense amplifier 39.

In addition, when four-pixel addition is performed, it is necessary to align horizontal transmission timings of the pixel data to be added with each other such that the logic circuit 32 adds the pixel data output from the column parallel AD conversion circuits 35-1 and 35-2. For this reason, the latch circuit 44 has not only a horizontal transmission latch but also a data holding latch for temporarily holding data.

In addition, a transmission signal FS1 for transmitting data to the data holding latch of the latch circuit 44 from the flip-flop 42, and a transmission signal FS2 for transmitting data to the horizontal transmission latch of the latch circuit 44 from the flip-flop 42, are supplied to the flip-flop 42 and the latch circuit 44. In addition, a transmission signal FS3 for transmitting data to the horizontal transmission latch from the data holding latch is supplied to the latch circuit 44.

Figure 5:
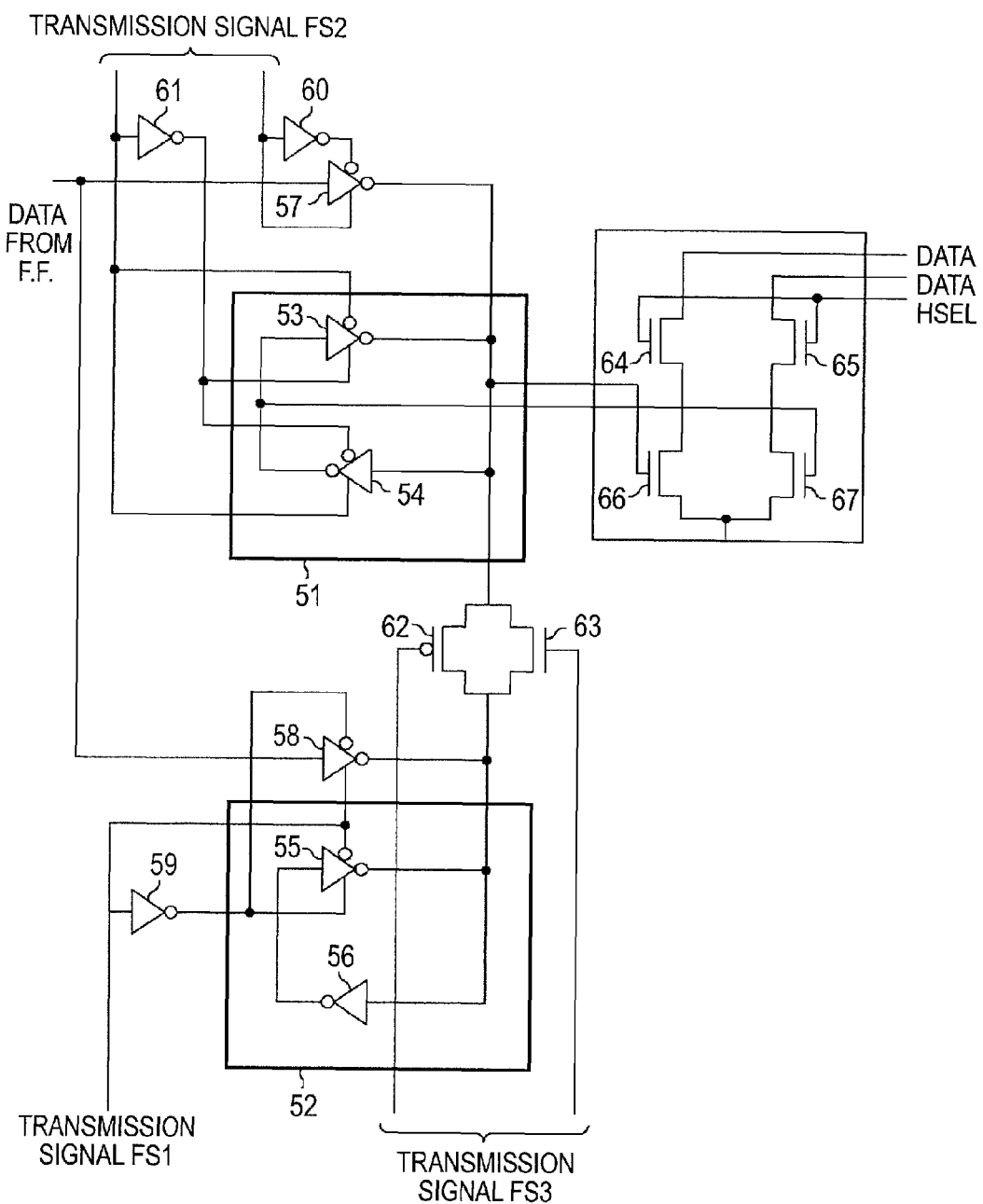
FIG. 5 is a block diagram illustrating a configuration example of the latch circuit.

FIG. 5 is a block diagram illustrating a configuration example of the latch circuit 44.

The latch circuit 44 includes the horizontal transmission latch 51 and the data holding latch 52. The horizontal transmission latch 51 includes NOT gates 53 and 54, and the data holding latch 52 includes NOT gates 55 and 56. In addition, pixel data from the flip-flop 42 is supplied to NOT gates 57 and 58.

The transmission signal FS1 for transmitting data to the data holding latch 52 from the flip-flop 42 is supplied to the NOT gate 59, and, at the same time, the pixel data transmitted from the flip-flop 42 according to the transmission signal FS1 is supplied to and held in the data holding latch 52 via the NOT gate 58.

In addition, the transmission signal FS2 for transmitting data to the horizontal transmission latch 51 from the flip-flop 42 is supplied to the NOT gates 60 and 61, and, at the same time, the pixel data transmitted from the flip-flop 42 according to the transmission signal FS2 is supplied to and held in the horizontal transmission latch 51 via the NOT gate 57.

The horizontal transmission latch 51 and the data holding latch 52 are connected to each other by transistors 62 and 63. In addition, when the transmission signal FS3 for transmitting data to the horizontal transmission latch 51 from the data holding latch 52 is supplied to gates of the transistors 62 and 63, the pixel data held in the data holding latch 52 is transmitted to the horizontal transmission latch 51.

In addition, when a selection signal HSEL for selecting a pixel column is supplied to transistors 64 and 65 from the column scanning circuit 36, the pixel data held in the horizontal transmission latch 51 is output via transistors 66 and 67.

As such, as described with reference to FIG. 3B, an operation at such a horizontal transmission timing that data obtained by adding the pixel data of the pixels A1, A3 and A4 and the pixel data of the pixel A2 are transmitted to the logic circuit 32 at the same timing, is possible by the latch circuit 44 having the data holding latch 52.

Next, transmission timings of the pixel data will be described with reference to FIGS. 6 and 7.

Figure 6:
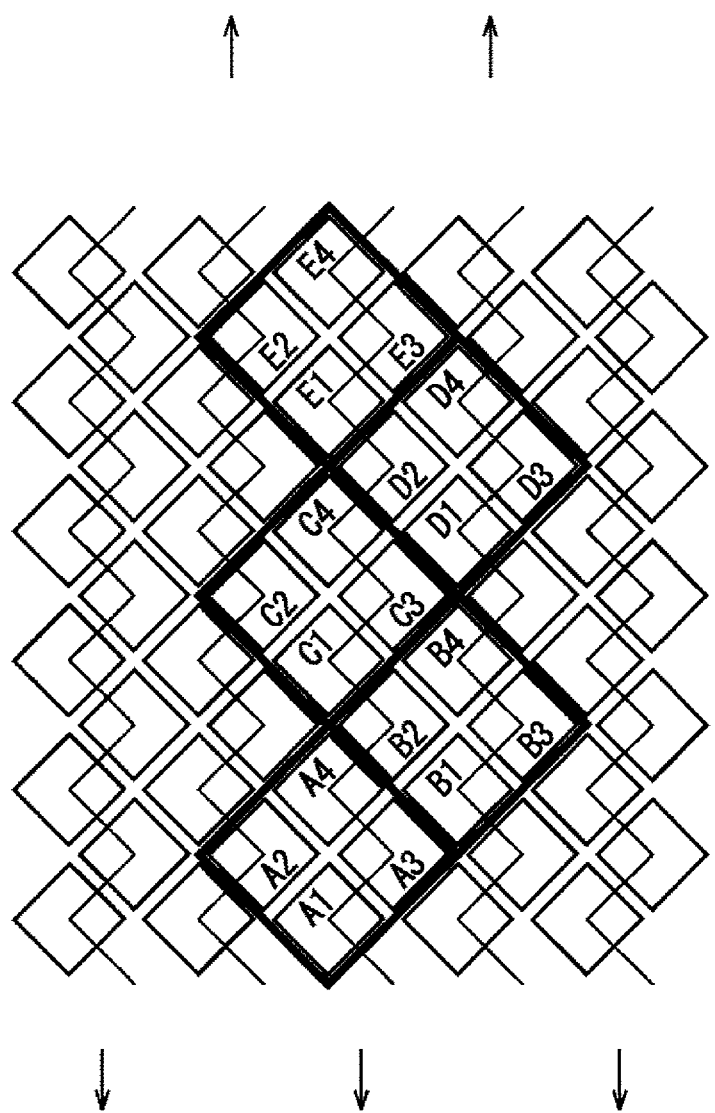
FIG. 6 is a diagram illustrating an arrangement of pixels.

FIG. 6 shows pixels in the oblique pixel arrangement as in FIGS. 3A and 3B, and, in order to describe transmission timings of the pixel data, the pixels A1 to A4, the pixels B1 to B4, the pixels C1 to C4, the pixels D1 to D4, and the pixels E1 to E4 are differentiated from each other every four pixels which are addition targets.

Figure 7:
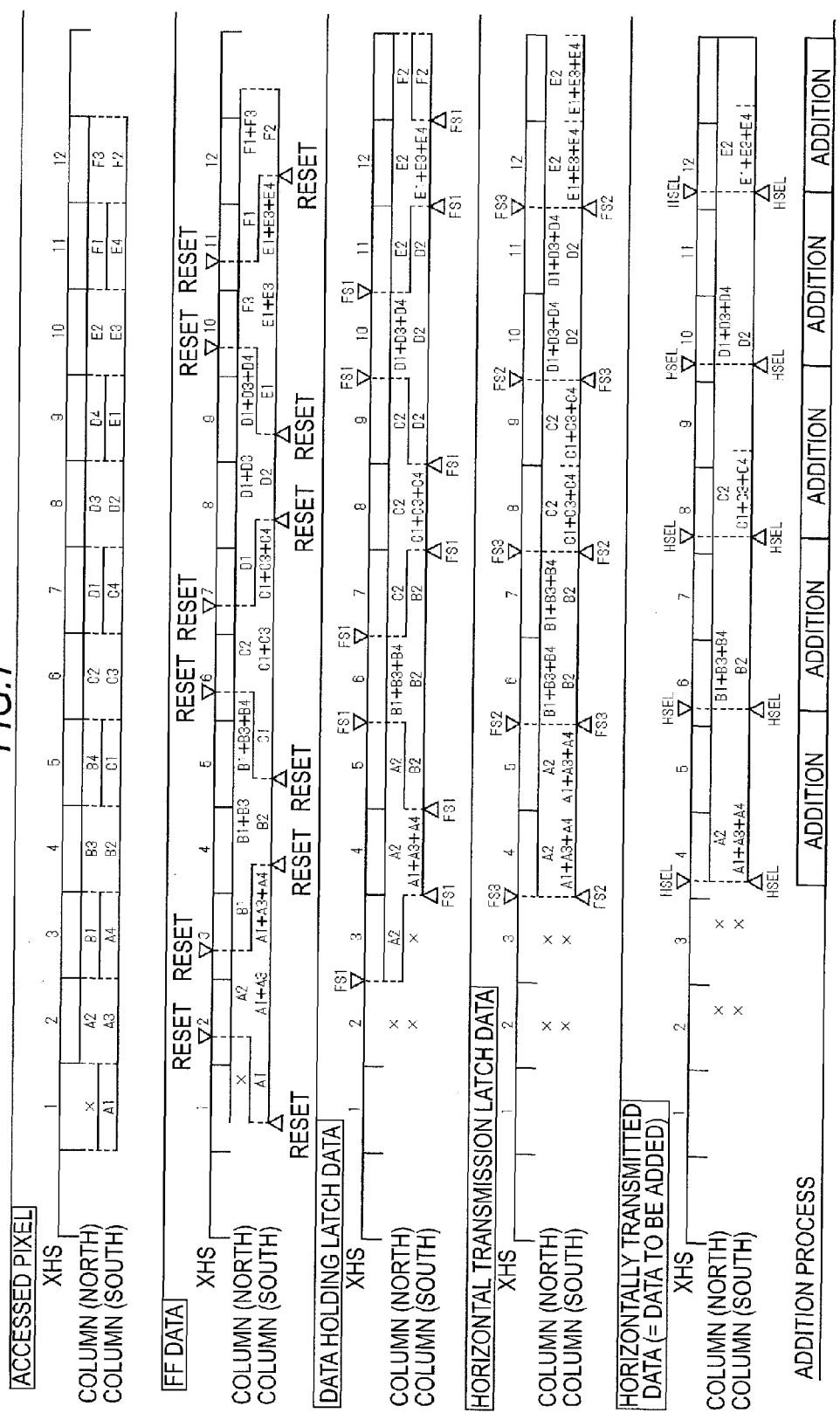
FIG. 7 is a diagram illustrating transmission timings of pixel data.

FIG. 7 shows pixels to be accessed according to a driving signal from the row scanning circuit 33, pixel data held in and added by the flip-flop 42, pixel data held in the data holding latch 52, pixel data held in the horizontal transmission latch 51, and pixel data (that is, pixel data to be added for pixel addition) horizontally transmitted to the logic circuit 32. In addition, in FIG. 7, data in the column parallel AD conversion circuit 35-1 disposed at the lower side (south) of the pixel array 31 is indicated by column (south), and data in the column parallel AD conversion circuit 35-2 disposed at the upper side (north) of the pixel array 31 is indicated by column (north).

First, in relation to a pixel to be accessed, the pixel A1 (the pixel in the first row in FIG. 6) is accessed by the column parallel AD conversion circuit 35-1 at a first phase of a horizontal transmission period XHS. Next, at a second phase of the horizontal transmission period XHS, the pixel A2 (the pixel in the second row in FIG. 6) is accessed by the column parallel AD conversion circuit 35-2, and, at the same time, the pixel A3 (the pixel in the second row in FIG. 6) is accessed by the column parallel AD conversion circuit 35-1.

In addition, at a third phase of the horizontal transmission period XHS, the pixel B1 (the pixel in the third row in FIG. 6) is accessed by the column parallel AD conversion circuit 35-2, and, at the same time, the pixel A4 (the pixel in the third row in FIG. 6) is accessed by the column parallel AD conversion circuit 35-1. Hereinafter, the pixels in the rows corresponding to the respective phases of the horizontal transmission period XHS are accessed.

In addition, in relation to pixel data held in and added by the flip-flop 42, the flip-flop 42 of the column parallel AD conversion circuit 35-1 is reset during the first phase of the horizontal transmission period XHS, and sequentially adds and holds pixel data of the pixels A1, A3 and A4 to be accessed until the next reset during the fourth phase of the horizontal transmission period XHS. Further, at the reset timing, the flip-flop 42 reads pixel data of the pixel B2 to be accessed, and holds the pixel data of the pixel B2 until the next reset during the fifth phase of the horizontal transmission period XHS.

On the other hand, the flip-flop 42 of the column parallel AD conversion circuit 35-2 is reset during the second phase of the horizontal transmission period XHS, and, at the reset timing, reads pixel data of the pixel A2 to be accessed, and holds the pixel data of the pixel A2 until the next reset during the third phase of the horizontal transmission period XHS. In addition, after the reset, the flip-flop 42 sequentially adds and holds the pixels B1, B3 and B4 to be accessed.

As such, the flip-flop 42 alternately performs the process of adding and holding pixel data of three pixels among four pixels to be added during three phases of the horizontal transmission period XHS, and the process of holding pixel data of one pixel of four pixels to be added next during the next phase of the horizontal transmission period XHS. In addition, the flip-flop 42 of the column parallel AD conversion circuit 35-1 and the flip-flop 42 of the column parallel AD conversion circuit 35-2 alternately perform the process of adding pixel data of three pixels and the process of holding pixel data of one pixel.

In addition, in relation to pixel data held in the data holding latch 52, the transmission signal FS1 is supplied to the flip-flop 42 and the data holding latch 52 of the column parallel AD conversion circuit 35-2 at a timing when the third phase of the horizontal transmission period XHS starts. The pixel data of the pixel A2 held in the flip-flop 42 of the column parallel AD conversion circuit 35-2 is transmitted to the data holding latch 52 according to the transmission signal FS1.

Next, the transmission signal FS1 is supplied to the flip-flop 42 and the data holding latch 52 of the column parallel AD conversion circuit 35-1 at a timing when the fourth phase of the horizontal transmission period XHS starts. Pixel data obtained by adding the pixel data of the pixels A1, A3 and A4 held in the flip-flop 42 of the column parallel AD conversion circuit 35-1 is transmitted to the data holding latch 52 according to the transmission signal FS1. Thereafter, the transmission signal FS1 is supplied to the flip-flop 42 and the data holding latch 52 of the column parallel AD conversion circuit 35-1 at a timing when the fifth phase of the horizontal transmission period XHS starts. The pixel data of the pixel B2 held in the flip-flop 42 of the column parallel AD conversion circuit 35-1 is transmitted to the data holding latch 52 according to the transmission signal FS1.

Further, the transmission signal FS1 is supplied to the flip-flop 42 and the data holding latch 52 of the column parallel AD conversion circuit 35-2 at a timing when the sixth phase of the horizontal transmission period XHS starts. Pixel data obtained by adding the pixel data of the pixels B1, B3 and B4 held in the flip-flop 42 of the column parallel AD conversion circuit 35-2 is transmitted to the data holding latch 52 according to the transmission signal FS1.

Hereinafter, the process where the transmission signal FS1 is alternately supplied to the column parallel AD conversion circuit 35-1 and the column parallel AD conversion circuit 35-2 two times for each phase of the horizontal transmission period XHS is repeatedly performed. Thereby, the pixel data added by and held in the flip-flop 42 is transmitted to and held in the data holding latch 52.

In addition, in relation to pixel data held in the horizontal transmission latch 51, at a timing when the fourth phase of the horizontal transmission period XHS starts, the transmission signal FS3 is supplied to the horizontal transmission latch 51 of the column parallel AD conversion circuit 35-2, and, at the same time, the transmission signal FS2 is supplied to the horizontal transmission latch 51 of the column parallel AD conversion circuit 35-1. According to the transmission signal FS3, the pixel data of the pixel A2 held in the data holding latch 52 of the column parallel AD conversion circuit 35-2 is transmitted to the horizontal transmission latch 51, and, according to the transmission signal FS2, pixel data obtained by adding the pixel data of the pixels A1, A3 and A4 held in the flip-flop 42 of the column parallel AD conversion circuit 35-1 is transmitted to the horizontal transmission latch 51.

Thereafter, at a timing when the sixth phase of the horizontal transmission period XHS starts, the transmission signal FS2 is supplied to the horizontal transmission latch 51 of the column parallel AD conversion circuit 35-2, and, at the same time, the transmission signal FS3 is supplied to the horizontal transmission latch 51 of the column parallel AD conversion circuit 35-1. According to the transmission signal FS2, pixel data obtained by adding the pixel data of the pixels B1, B3 and B4 held in the flip-flop 42 of the column parallel AD conversion circuit 35-2 is transmitted to the horizontal transmission latch 51, and, according to the transmission signal FS3, the pixel data of the pixel B2 held in the data holding latch 52 of the column parallel AD conversion circuit 35-1 is transmitted to the horizontal transmission latch 51.

Hereinafter, in the same manner, the process where the transmission signal FS2 and the transmission signal FS3 are alternately supplied to the column parallel AD conversion circuit 35-1 and the column parallel AD conversion circuit 35-2 is repeatedly performed every two phases of the horizontal transmission period XHS. Thereby, pixel data of pixels which are four-pixel addition targets is simultaneously transmitted to and held in the horizontal transmission latch 51.

In addition, in relation to pixel data (that is, pixel data of pixels to be added) which is horizontally transmitted to the logic circuit 32, the selection signal HSEL is simultaneously supplied to the latch circuit 44 of the column parallel AD conversion circuit 35-1 and the latch circuit 44 of the column parallel AD conversion circuit 35-2 at a predetermined timing after the fourth phase of the horizontal transmission period XHS starts. According to the selection signal HSEL, the pixel data of the pixel A2 held in the horizontal transmission latch 51 of the column parallel AD conversion circuit 35-2, and the pixel data obtained by adding the pixel data of the pixels A1, A3 and A4, held in the horizontal transmission latch 51 of the column parallel AD conversion circuit 35-1, are horizontally transmitted to and added by the logic circuit 32.

Here, the predetermined timing after the phase of the horizontal transmission period XHS starts is, for example, a timing during which the pixel data transmitted according to the transmission signal FS2 or FS3 supplied during the same phase is made to wait for a time period necessary until being fixed by the horizontal transmission latch 51. With this, it is possible to prevent the pixel data held in the horizontal transmission latch 51 at the previous phase from being transmitted horizontally by mistake.

Thereafter, the selection signal HSEL is simultaneously supplied to the latch circuit 44 of the column parallel AD conversion circuit 35-1 and the latch circuit 44 of the column parallel AD conversion circuit 35-2 at a predetermined timing after the sixth phase of the horizontal transmission period XHS starts. According to the selection signal HSEL, the pixel data obtained by adding the pixel data of the pixels B1, B3 and B4, held in the horizontal transmission latch 51 of the column parallel AD conversion circuit 35-2, and the pixel data of the pixel B2 held in the horizontal transmission latch 51 of the column parallel AD conversion circuit 35-1 are horizontally transmitted to and added by the logic circuit 32.

Hereinafter, the selection signal HSEL is simultaneously supplied to the latch circuit 44 of the column parallel AD conversion circuit 35-1 and the latch circuit 44 of the column parallel AD conversion circuit 35-2 every two phases of the horizontal transmission period XHS at a predetermined timing when each phase of the horizontal transmission period XHS starts, and the pixel data of four pixels is added by the logic circuit 32.

As such, in the CMOS sensor 23, the pixel data is transmitted according to the transmission signals FS1 to FS3 and the selection signal HSEL. Here, the transmission signals FS1 to FS3 and the selection signal HSEL are output at timings according to the processes which the logic circuit 32 performs based on the phases of the horizontal transmission period XHS.

For example, the logic circuit 32 determines which one of the (4×K+1)-th phase, the (4×K+2)-th phase, the (4×K+3)-th phase, and the (4×K+4)-th phase corresponds to a current phase of the horizontal transmission period XHS. Here, K is a natural number including 0.

In addition, it is determined that the current phase of the horizontal transmission period XHS is the (4×K+1)-th phase, the logic circuit 32 outputs the reset signal to the flip-flop 42 of the column parallel AD conversion circuit 35-1, and outputs the transmission signal FS1 to the flip-flop 42 and the latch circuit 44 of the column parallel AD conversion circuit 35-1. However, the logic circuit 32 outputs the reset signal after outputting the transmission signal FS1 as shown in the fifth phase of the horizontal transmission period XHS in FIG. 7.

In addition, it is determined that the current phase of the horizontal transmission period XHS is the (4×K+2)-th phase, the logic circuit 32 outputs the reset signal to the flip-flop 42 of the column parallel AD conversion circuit 35-2, outputs the transmission signals FS1 and FS2 to the flip-flop 42 and the latch circuit 44 of the column parallel AD conversion circuit 35-2, and outputs the selection signal HSEL to the latch circuit 44 of the column parallel AD conversion circuit 35-2. Further, in this case, the logic circuit 32 outputs the transmission signal FS3 and the selection signal HSEL to the latch circuit 44 of the column parallel AD conversion circuit 35-1.

However, the logic circuit 32 outputs the selection signal HSEL after outputting the transmission signal FS3, and outputs the selection signal HSEL and the reset signal after outputting the transmission signals FS1 and FS2, as shown in the sixth phase of the horizontal transmission period XHS in FIG. 7. In addition, the timings when the transmission signals FS1 and FS2 are output, or the timings when the selection signal HSEL and the reset signal are output may be respectively the same as or different from each other.

Further, it is determined that the current phase of the horizontal transmission period XHS is the (4×K+3)-th phase, the logic circuit 32 outputs the reset signal to the flip-flop 42 of the column parallel AD conversion circuit 35-2, and outputs the transmission signal FS1 to the flip-flop 42 and the latch circuit 44 of the column parallel AD conversion circuit 35-2. However, the logic circuit 32 outputs the reset signal after outputting the transmission signal FS1 as shown in the seventh phase of the horizontal transmission period XHS in FIG. 7.

In addition, it is determined that the current phase of the horizontal transmission period XHS is the (4×K+4)-th phase, the logic circuit 32 outputs the transmission signal FS3 to the flip-flop 42 and the latch circuit 44 of the column parallel AD conversion circuit 35-2, and outputs the selection signal HSEL to the latch circuit 44 of the column parallel AD conversion circuit 35-2. Further, in this case, the logic circuit 32 outputs the reset signal to the flip-flop 42 of the column parallel AD conversion circuit 35-1, outputs the transmission signals FS1 and FS2 to the flip-flop 42 and the latch circuit 44 of the column parallel AD conversion circuit 35-1, and outputs the selection signal HSEL to the latch circuit 44 of the column parallel AD conversion circuit 35-1.

However, the logic circuit 32 outputs the selection signal HSEL after outputting the transmission signal FS3, and outputs the selection signal HSEL and the reset signal after outputting the transmission signals FS1 and FS2, as shown in the eighth phase of the horizontal transmission period XHS in FIG. 7. In addition, the timings when the transmission signals FS1 and FS2 are output, or the timings when the selection signal HSEL and the reset signal are output may be respectively the same as or different from each other.

As such, the logic circuit 32 repeatedly performs the processes every four phases of the horizontal transmission period XHS, but performs a particular process if K of when a phase of the horizontal transmission period XHS is determined is 0.

For example, if K is 0 and it is determined that a phase of the horizontal transmission period XHS is the (4×K+1)-th phase (that is, the horizontal transmission period XHS is the first phase), the logic circuit 32 performs only a process where the reset signal is output to the flip-flop 42 of the column parallel AD conversion circuit 35-1. In addition, if K is 0 and it is determined that a phase of the horizontal transmission period XHS is the (4×K+2)-th phase (that is, the horizontal transmission period XHS is the second phase), the logic circuit 32 performs only a process where the reset signal is output to the flip-flop 42 of the column parallel AD conversion circuit 35-2. That is to say, in this case, the logic circuit 32 does not output the selection signal HSEL.

In other words, when the horizontal transmission period XHS is the second phase, since all pieces of pixel data of four pixels to be added is not collected at the horizontal transmission latches 51 of the latch circuits 44 of the column parallel AD conversion circuits 35-1 and 35-2, the logic circuit 32 performs the particular process. Thereby, it is possible to prevent invalid data from being transmitted to the logic circuit 32.

In addition, if K of when a phase of the horizontal transmission period XHS is determined is 0, the logic circuit 32 may treat transmitted data as being invalid. That is to say, when the horizontal transmission period XHS is the second phase (=4×0+2), the logic circuit 32 may treat data transmitted from the latch circuits 44 of the column parallel AD conversion circuits 35-1 and 35-2 according to the selection signal HSEL, as being invalid.

Figure 8:
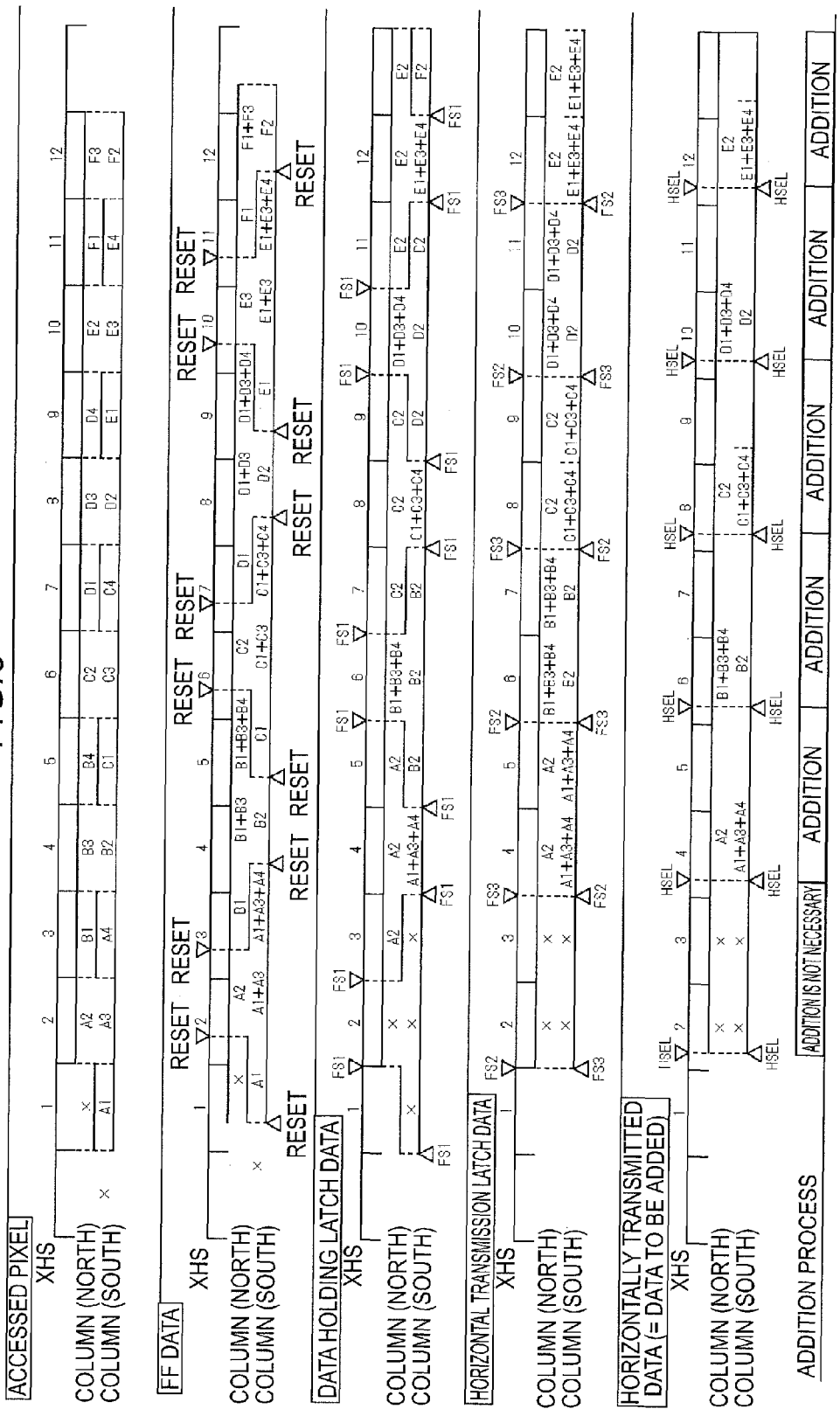
FIG. 8 is a diagram illustrating transmission timings of pixel data.

For example, FIG. 8 shows transmission timings of pixel data in a case where the logic circuit 32 treats data as being invalid when the horizontal transmission period XHS is the second phase. In addition, in FIG. 8, a timing when data is treated as being invalid is denoted with "x".

As shown in FIG. 8, when the horizontal transmission period XHS is the second phase, as described above, the selection signal HSEL is output to the latch circuits 44 of the column parallel AD conversion circuits 35-1 and 35-2 according to the process of when the current phase of the horizontal transmission period XHS is determined as being the (4×K+2)-th phase. At this time, the logic circuit 32 performs a process of no necessity of addition for pixel data transmitted according to the selection signal HSEL. Since it is possible to prevent the addition process from being performed when pixel data of four pixels to be added is not collected by performing the particular process, a desired image having no errors can be reliably obtained.

By transmitting the pixel data at the timings, the logic circuit 32 can add only pixel data which is simultaneously output from the column parallel AD conversion circuit 35-1 and the column parallel AD conversion circuit 35-2, and can perform the effective addition process. Further, it is possible to reduce the number of design processes and the circuit area of the logic circuit 32.

As above, the transmission path for transmitting pixel data from the flip-flop 42 to the horizontal transmission latch 51 and the transmission path for transmitting pixel data from the flip-flop 42 to the horizontal transmission latch 51 via the data holding latch 52 are used through the distinction between the column parallel AD conversion circuit 35-1 and the column parallel AD conversion circuit 35-2, and the transmission signal FS1, the transmission signal FS2, the transmission signal FS3 are supplied at the above-described timings. Thereby, in relation to four pixels which are four-pixel addition targets, pixel data obtained by adding pixel data of three pixels and pixel data of one pixel can be transmitted to the logic circuit 32 at the same time.

Here, it is necessary for the logic circuit 32 to change columns which are addition targets every two phases of the horizontal transmission period XHS. That is to say, since the pixels are arranged in the oblique pixel arrangement in the pixel array 31, in relation to four pixels which are four-pixel addition targets, columns are misaligned every two phases of the horizontal transmission period XHS in the pixels read by the column parallel AD conversion circuit 35-1 and the pixels read by the column parallel AD conversion circuit 35-2. Therefore, in order to handle the column misalignment, the logic circuit 32 changes columns which are addition targets every two phases of the horizontal transmission period XHS and performs the addition process.

Referring to FIGS. 9 to 13, change of columns which are addition targets every two phases of the horizontal transmission period XHS will be described.

FIGS. 9 to 12 show pixels to be processed for each horizontal transmission period XHS, and transmission timings of pixel data of the pixels every two phases of the horizontal transmission period XHS. In addition, here, pixels of up to the eighth column pixel from the left end in the pixel array 31 regardless of validity will be described.

Figure 9:
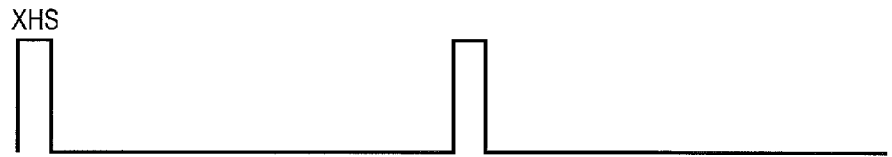
FIG. 9 is a diagram illustrating transmission timings of pixel data.
Figure 9:
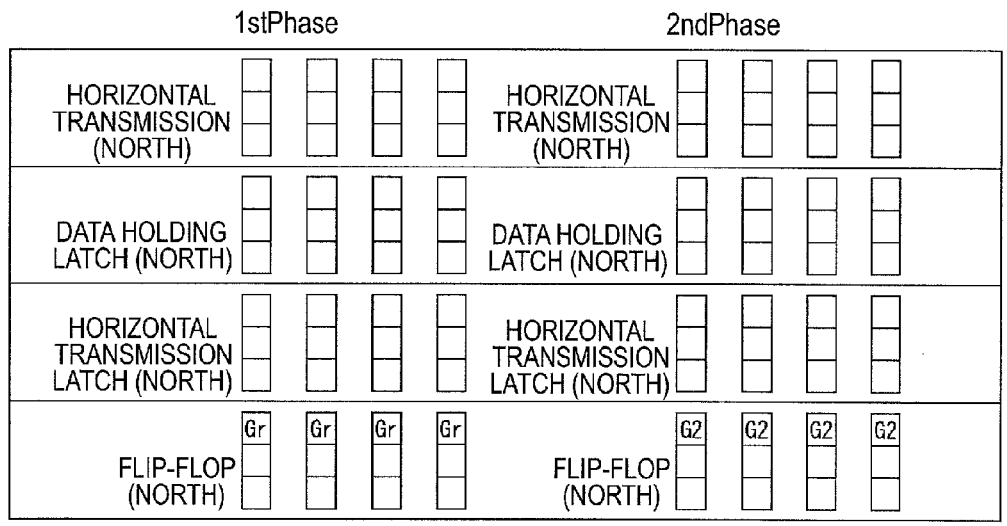
Figure 9:
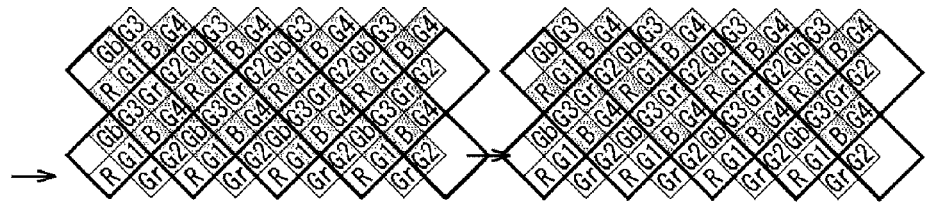
Figure 9:
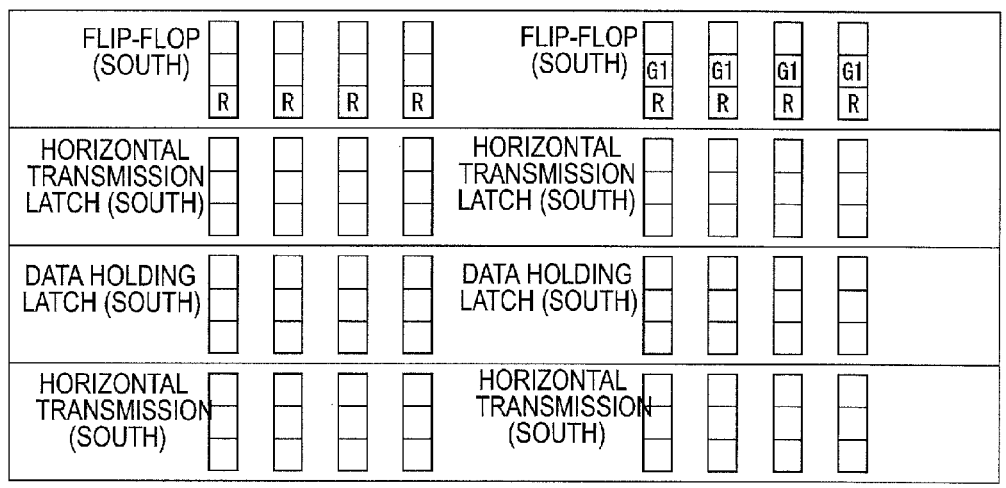

As shown in FIG. 9, the pixels in the first row are driven targets at the first phase of the horizontal transmission period XHS, pixel data (R) of the even column pixels in the first row is read to the flip-flop 42 of the column parallel AD conversion circuit 35-1 (south), and pixel data (Gr) of the odd column pixels in the first row is read to the flip-flop 42 of the column parallel AD conversion circuit 35-2 (north).

Thereafter, the pixels in the second row are driven targets at the second phase of the horizontal transmission period XHS, pixel data (G1) of the even column pixels in the second row is read to the flip-flop 42 of the column parallel AD conversion circuit 35-1, and is added to the pixel data (R). On the other hand, since the pixel data (Gr) of the odd column pixels in the first row is not the four-pixel addition target, the pixel data (Gr) is reset in the flip-flop 42 of the column parallel AD conversion circuit 35-2, and the pixel data (G2) of the odd column pixels in the second row is read.

Figure 10:
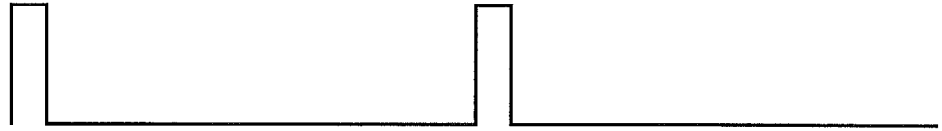
FIG. 10 is a diagram illustrating transmission timings of pixel data.
Figure 10:
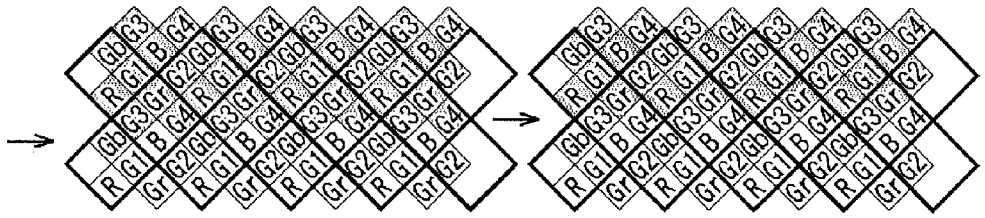

Next, as shown in FIG. 10, at the third phase of the horizontal transmission period XHS, first, the pixel data (G2) held in the flip-flop 42 of the column parallel AD conversion circuit 35-2 is transmitted to the data holding latch 52. Then, the pixel data (Gb) of the even column pixels in the third row is read to the flip-flop 42 of the column parallel AD conversion circuit 35-1 and is added to the pixel data (R) and the pixel data (G1). On the other hand, the pixel data (B) of the odd column pixels in the third row is read to the flip-flop 42 of the column parallel AD conversion circuit 35-2.

Here, the pixel data up to the third phase of the horizontal transmission period XHS is regarded to be invalid since pixel data which is a four-pixel addition target is not collected.

Further, at the fourth phase of the horizontal transmission period XHS, first, the pixel data (G2) held in the data holding latch 52 of the column parallel AD conversion circuit 35-2 is transmitted to the horizontal transmission latch 51 for horizontal transmission. At the same time, the pixel data (R), the pixel data (G1), and the pixel data (Gb) held in the flip-flop 42 of the column parallel AD conversion circuit 35-1 are transmitted to the horizontal transmission latch 51 for horizontal transmission.

Figure 13:
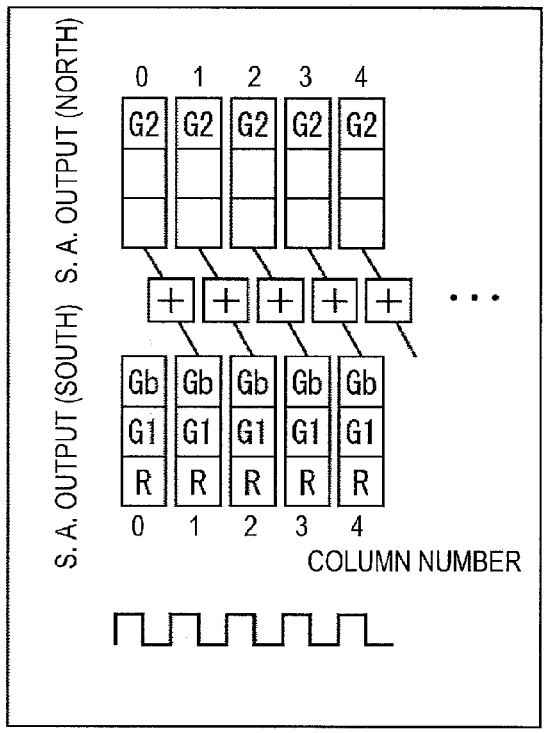
FIG. 13 is a diagram illustrating a case where columns which are addition targets are changed every two phases of the horizontal transmission period.
Figure 13:
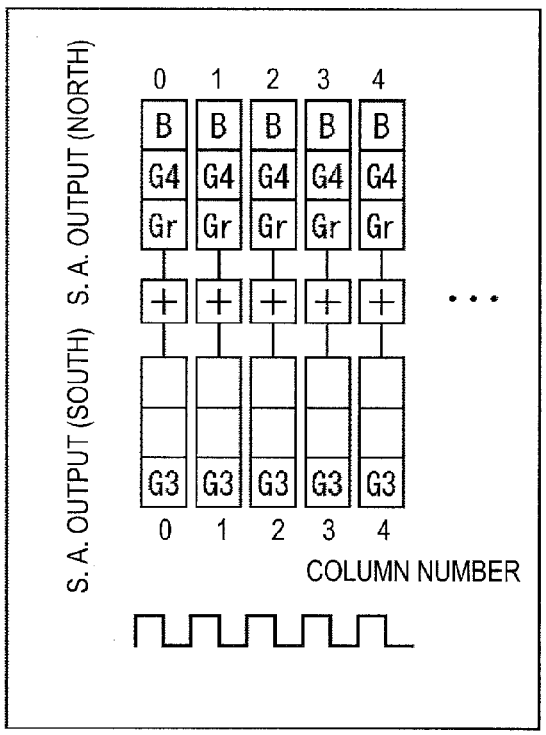

Thereby, the pixel data (G2), the pixel data (R), the pixel data (G1), and the pixel data (Gb) are added in the logic circuit 32; however, as shown in the upper side of FIG. 13, outputs from the n-th column counter 38 of the column parallel AD conversion circuit 35-2 (north) and the (n+1)-th column counter 38 of the column parallel AD conversion circuit 35-1 (south) are added in the logic circuit 32. That is to say, at the fourth phase of the horizontal transmission period XHS, the outputs from four pixels which are the four-pixel addition targets are misaligned by one column in the counter 38 of the column parallel AD conversion circuit 35-2 and the counter 38 of the column parallel AD conversion circuit 35-1, and thus the logic circuit 32 performs the addition by misaligning the columns.

Next, at the fourth phase of the horizontal transmission period XHS, the pixel data (G3) of the even column pixels in the fourth row is read to the flip-flop 42 of the column parallel AD conversion circuit 35-1. On the other hand, the pixel data (G4) of the odd column pixels in the fourth row is read to the flip-flop 42 of the column parallel AD conversion circuit 35-2 and is added to the pixel data (B).

Figure 11:
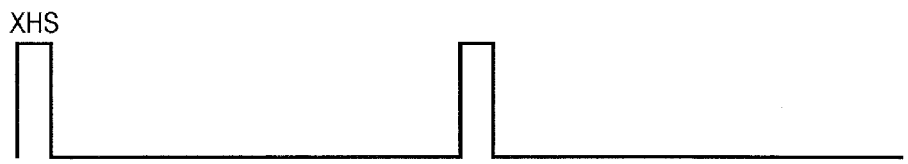
FIG. 11 is a diagram illustrating transmission timings of pixel data.
Figure 11:
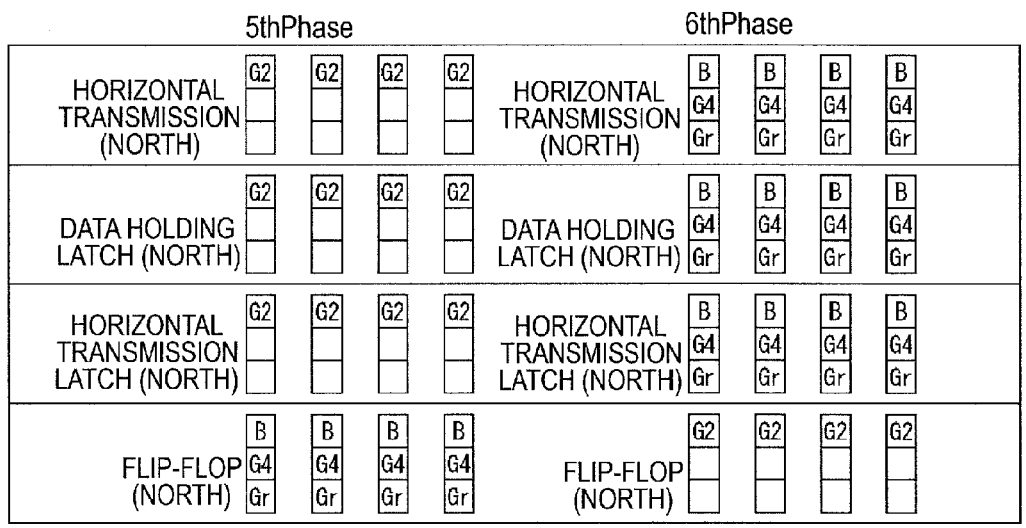
Figure 11:
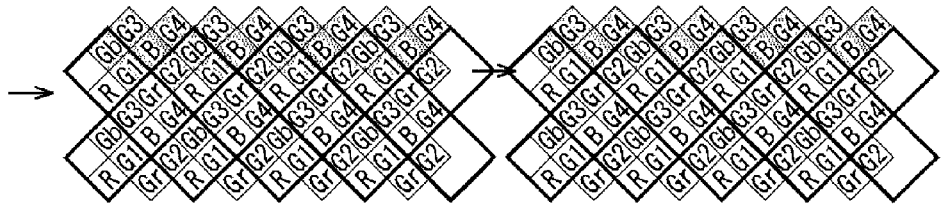
Figure 11:
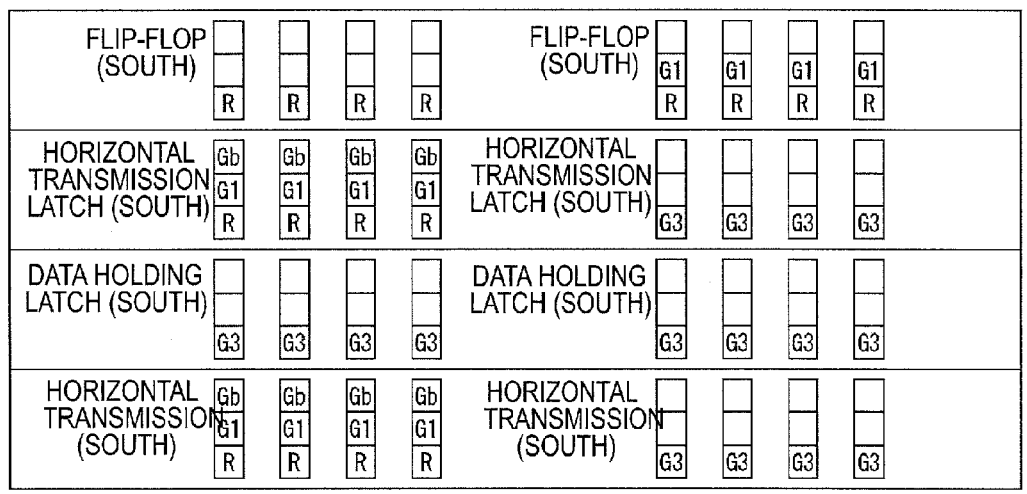

Next, as shown in FIG. 11, at the fifth phase of the horizontal transmission period XHS, first, the pixel data (G3) held in the flip-flop 42 of the column parallel AD conversion circuit 35-1 is transmitted to the data holding latch 52. In addition, the pixel data (R) of the even column pixels in the fifth row is read to and held in the flip-flop 42 of the column parallel AD conversion circuit 35-1. On the other hand, the pixel data (Gr) of the odd column pixels in the fifth row is read to and held in the flip-flop 42 of the column parallel AD conversion circuit 35-2, and is added to the pixel data (B) and the pixel data (G4).

Further, at the sixth phase of the horizontal transmission period XHS, first, the pixel data (G3) held in the data holding latch 52 of the column parallel AD conversion circuit 35-1 is transmitted to the horizontal transmission latch 51 for horizontal transmission. At the same time, the pixel data (B), the pixel data (G4), and the pixel data (Gr) held in the flip-flop 42 of the column parallel AD conversion circuit 35-2 are transmitted to the horizontal transmission latch 51 for horizontal transmission.

Thereby, the pixel data (G3), the pixel data (B), the pixel data (G4), and the pixel data (Gr) are added in the logic circuit 32; however, as shown in the lower side of FIG. 13, outputs from the n-th column counter 38 of the column parallel AD conversion circuit 35-2 (north) and the n-th column counter 38 of the column parallel AD conversion circuit 35-1 (south) are added in the logic circuit 32. That is to say, at the fourth phase of the horizontal transmission period XHS, the outputs from four pixels which are the four-pixel addition targets are in the same column in the counter 38 of the column parallel AD conversion circuit 35-2 and the counter 38 of the column parallel AD conversion circuit 35-1, and thus the logic circuit 32 performs the addition by not misaligning the columns.

Next, at the sixth phase of the horizontal transmission period XHS, the pixel data (G1) of the even column pixels in the sixth row is read to the flip-flop 42 of the column parallel AD conversion circuit 35-1, and is added to the pixel data (R). On the other hand, the pixel data (G2) of the odd column pixels in the sixth row is read to the flip-flop 42 of the column parallel AD conversion circuit 35-2.

Figure 12:
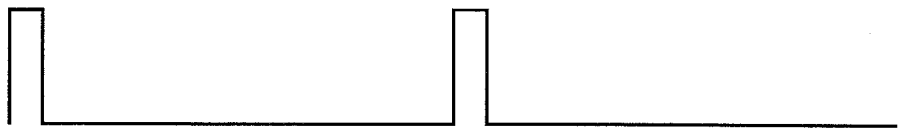
FIG. 12 is a diagram illustrating transmission timings of pixel data.
Figure 12:
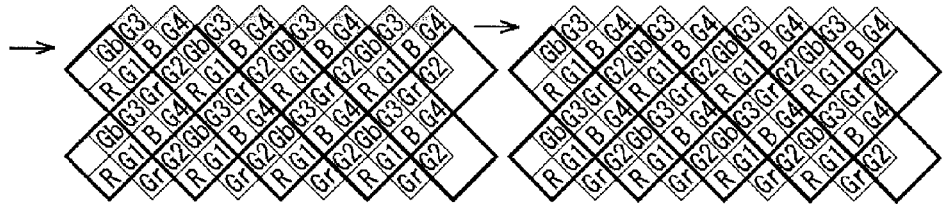

Next, as shown in FIG. 12, at the seventh phase of the horizontal transmission period XHS, first, the pixel data (G2) held in the flip-flop 42 of the column parallel AD conversion circuit 35-2 is transmitted to the data holding latch 52. In addition, the pixel data (Gb) of the even column pixels in the seventh row is read to and held in the flip-flop 42 of the column parallel AD conversion circuit 35-1, and is added to the pixel data (R) and the pixel data (G1). On the other hand, the pixel data (B) of the odd column pixels in the seventh row is read to and held in the flip-flop 42 of the column parallel AD conversion circuit 35-2.

In addition, at the eighth phase of the horizontal transmission period XHS, pixel data is transmitted in the same manner as the fourth phase, and, hereinafter, the transmission process of the pixel data is repeatedly performed every four phases in the same manner, and the pixel addition is repeatedly performed in the logic circuit 32. That is to say, addition for misaligned columns which are addition targets and addition for the same column are alternately performed every two phases of the horizontal transmission period XHS.

In other words, the logic circuit 32 determines which one of the 2×m-th phase and the 2×(m+1)-th phase corresponds to a current phase of the horizontal transmission period XHS. At the 2×m-th phase, the logic circuit 32 adds the N-th output pixel data of the column parallel AD conversion circuit 35-2 to the (N+1)-th output pixel data of the column parallel AD conversion circuit 35-1. On the other hand, at the 2×(m+1)-th phase, the logic circuit 32 adds the N-th output pixel data of the column parallel AD conversion circuit 35-2 to the N-th output pixel data of the column parallel AD conversion circuit 35-1. Here, m is a natural number, and N is a natural number including 0.

Thereby, in the CMOS sensor 23 since the pixels are arranged in the oblique pixel arrangement, the pixels in the even column are read by the column parallel AD conversion circuit 35-1, and the pixels in the odd column are read by the column parallel AD conversion circuit 35-2, it is possible to accurately perform a pixel addition for four adjacent pixels.

As above, it is possible to improve a saturated signal amount by performing the four-pixel addition in the CMOS sensor 23. In addition, at this time, a pixel information amount is not reduced since the pixel addition can be performed using pixel data obtained from all the pixels of the pixel array 31.

In addition, the latch circuit 44 includes the data holding latch 52, and pixel data to be added can be simultaneously output from the counters 38 by the use of the path where the pixel data is horizontally transmitted via the data holding latch 52 and the path where the pixel data is horizontally transmitted not via the data holding latch 52. Thereby, it is possible to perform the pixel addition efficiently. In addition, it is possible to reliably perform the pixel addition by adjusting a timing for transmitting pixel data and a timing for changing columns where pixel data is added.

Further, an embodiment of the present disclosure is not limited to the above-described embodiment but may have various modifications in a scope not departing from the spirit of the present disclosure.

The present disclosure contains subject matter related to that disclosed in Japanese Priority Patent Application JP 2010-274259 filed in the Japan Patent Office on Dec. 9, 2010, the entire content of which is hereby incorporated by reference.

What is claimed is:
1. An imaging device comprising:
   a pixel array that has a plurality of pixels disposed according to an oblique pixel arrangement;
   a first conversion means for performing digital conversion for pixel signals output from pixels in an even column of the pixel array;
   a second conversion means for performing digital conversion for pixel signals output from pixels in an odd column of the pixel array; and an addition means for adding pixel data output from the first conversion means and the second conversion means, wherein each of the first conversion means and the second conversion means includes a counter having a flip-flop, a first latch circuit, and a second latch circuit, wherein the counter has a path where the pixel data is transmitted from the flip-flop to the addition means via the first latch circuit and a path where the pixel data is transmitted from the flip-flop to the addition means via the second latch circuit and the first latch circuit, and wherein the pixel data is transmitted using the paths such that the pixel data to be added by the addition means is output from the first conversion means and the second conversion means at the same timing.

2. The imaging device according to claim 1, wherein the addition means changes columns which are addition targets between a column of the pixel data output from the first conversion means and a column of the pixel data output from the second conversion means every two phases of a horizontal transmission period and thereby adds the pixel data.

3. An imaging device comprising:
a pixel array that has a plurality of pixels disposed according to an oblique pixel arrangement and a plurality of vertical signal lines, with each of the plurality of vertical signal lines being connected to ones of the plurality of pixels and extending in a column direction;
a first conversion means for performing digital conversion of pixel signals output from pixels connected to even-numbered ones of the plurality of vertical signal lines;
a second conversion means for performing digital conversion of pixel signals output from pixels connected to odd-numbered ones of the plurality of vertical signal lines; and
an addition means for adding together pixel data output from the first conversion means and pixel data output from the second conversion means,
wherein each of the first conversion means and the second conversion means includes a counter having a flip-flop, a first latch circuit configured to receive an output of the flip-flop, and a second latch circuit configured to receive an output of the flip-flop.

4. The imaging device of claim 3,
wherein the plurality of pixels are divided into a plurality of addition groups, with each of the plurality of addition groups comprising four pixels, and
for each of the plurality of addition groups, the addition means adds together pixel data corresponding to the four pixels of the respective addition group.

5. The imaging device of claim 4,
wherein, for each of the plurality of addition groups, the addition means adds pixel data from only one of the pixels of the respective addition group, which is supplied from one of the first and second conversion means, to pixel data corresponding to the other three pixels of the respective addition group, which is supplied from the other one of the first and second conversion means.

6. The imaging device of claim 5,
wherein the one of the first and second conversion means that supplies pixel data from only one pixel alternates every two phases of a horizontal transfer period.

7. The imaging device of claim 4,
wherein the plurality of addition groups are disposed in an arrangement corresponding to the oblique pixel arrangement, the arrangement including columns of addition groups,
wherein the addition means alternates every two phases of a horizontal transfer period between adding pixel data from addition groups in even-numbered columns of addition groups and adding pixel data from addition groups in odd-numbered columns of addition groups.

8. The imaging device of claim 3,
wherein the counter of each of the first conversion means and the second conversion means has a first path whereby the pixel data is transmitted from the flip-flop to the addition means via the first latch circuit and a second path whereby the pixel data is transmitted from the flip-flop to the addition means via the second latch circuit and the first latch circuit, and
wherein the pixel data is transmitted using the first and second paths such that the pixel data to be added by the addition means is output from the first conversion means and the second conversion means at the same timing.

9. The imaging device of claim 3,
wherein the addition means adds together pixel data output from the first conversion means and pixel data output from the second conversion means such that pixel data from a given one of the even-numbered ones of the plurality of vertical signal lines is added to pixel data from one of the odd-numbered ones of the plurality of vertical signal lines, and
the one of the odd-numbered ones of the plurality of vertical signal lines whose pixel data is added to the given one of the even-numbered ones of the plurality of signal lines changes every two phases of a horizontal transfer period.

10. The imaging device of claim 3,
wherein each of the plurality of signal lines is connected to those pixels included in two adjacent columns of the plurality of pixels.

11. An imaging device comprising:
a pixel array that has a plurality of pixels disposed according to an oblique pixel arrangement and a plurality of vertical signal lines, with each of the plurality of vertical signal lines being connected to ones of the plurality of pixels and extending in a column direction;
a first conversion section configured to perform digital conversion of pixel signals output from pixels connected to even-numbered ones of the plurality of vertical signal lines;
a second conversion section configured to perform digital conversion of pixel signals output from pixels connected to odd-numbered ones of the plurality of vertical signal lines; and
an addition section configured to add together pixel data output from the first conversion section and pixel data output from the second conversion section,
wherein each of the first conversion section and the second conversion section includes a counter having a flip-flop, a first latch circuit configured to receive an output of the flip-flop, and a second latch circuit configured to receive an output of the flip-flop.

* * * * *